Figure 1:
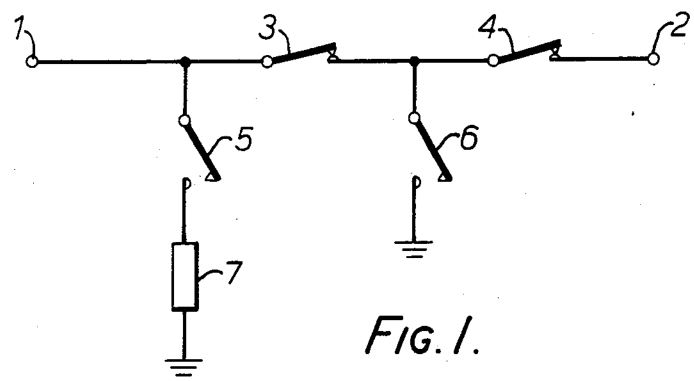

United States Patent [19]
Owen
[11] Patent Number: 4,543,495
[45] Date of Patent: Sep. 24, 1985

[54] DIODE BRIDGE SWITCHING CIRCUIT WITH HIGH ATTENUATION

[75] Inventor: David P. Owen, Dunstable, England
[73] Assignee: Marconi Instruments Limited, Chelmsford, England

[21] Appl. No.: 378,287
[22] Filed: May 14, 1982

[30] Foreign Application Priority Data

May 21, 1981 [GB] United Kingdom ................. 8115666

[51] Int. Cl.[4] ......................... H03K 17/54; H03K 5/08
[52] U.S. Cl. .................................... 307/257; 307/256; 307/542; 307/549
[58] Field of Search ............... 307/544, 549, 550, 256, 307/257, 542, 565

[56] References Cited

U.S. PATENT DOCUMENTS 3,011,129 11/1961 Magleby et al. .................... 307/257
3,127,564 3/1964 Giger .................................. 307/257
3,277,949 10/1966 Walbridge ........................... 307/257
3,350,573 10/1967 Barany ................................ 307/544
3,449,596 6/1969 Milberger et al. .................. 307/257
3,602,740 8/1971 Kelling ............................... 307/257

FOREIGN PATENT DOCUMENTS 801062 9/1958 United Kingdom .

*Primary Examiner*—Stanley D. Miller
*Assistant Examiner*—B. P. Davis
*Attorney, Agent, or Firm*—Kenyon & Kenyon

[57] ABSTRACT

A switching circuit is suitable for pulse modulating a high frequency carrier signal. The switching circuit provides little attenuation of the carrier signal while it is in its conductive state, but provides very high electrical isolation while in its non-conductive state so that under these conditions very little signal is allowed to appear at an output terminal. The switching circuit comprises four four-arm diode bridges, two of which are in series in the signal path and the other two of which are connected in shunt. When the two serial diode bridges are conductive, and the two shunt bridges are non-conductive an output pulse is obtained, but when the conductive states are reversed no signal is present at the output. One of the shunt connected diode bridges is associated with a matched impedance which is presented to the source of high carrier frequency signals, while the switching circuit presents a high impedance and this prevents the generation of a standing or reflected wave at the input terminal. Additional diodes are associated with the two series connected diode bridges to further attenuate any high frequency signal which partially breaks through.

9 Claims, 4 Drawing Figures

8 consisting of four diodes 9, 10, 11 and 12 connected between an input terminal 13 and an output terminal 14. The four diodes are connected in a ring with one pair of diodes 9, 11 being poled in the opposite sense to the other pair of diodes 10, 12. Two bias terminals 15 and 16 enable the four diodes to be turned on and off as required. When terminal 15 is connected to a supply of positive potential and terminal 16 is connected to a supply of negative potential, the four diodes are all turned off, i.e. rendered non-conductive, and consequently no high frequency signal is transferred from the input terminal 13 to the output terminal 14. Conversely, when terminal 15 is connected to a negative supply and terminal 16 to a positive supply, the four diodes are forward biassed by the current flowing between these two terminals. Under these conditions, the high frequency signal is transferred from the input terminal 13 to the output terminal 14 with only little attenuation. Resistors 17 and 18 are present to limit the current flowing through the four diodes, whilst they are forward biassed.

Provided that the driving waveforms applied to terminals 15 and 16 are balanced, there will be little d.c. off-set between the input and output terminals 13 and 14 respectively. Each diode may be a silicon junction diode of the kind suitable for use at radio frequencies. Such diodes typically have an "on" resistance of only 2 or 3 ohms, and can switch from one conductive state to the other very rapidly indeed. The whole diode bridge can switch in less than 50 nS. Although Schottky barrier diodes could be used, as they have fast switching speeds, and can handle radio frequencies, they exhibit higher resistances when conductive.

The four-arm diode bridge 8 is sometimes referred to as a sampling bridge, but in its basic form it is quite unsuitable on its own for use as a switching circuit to produce a pulse modulated high frequency carrier signal. This is because the diode bridge cannot on its own be positioned in a serial path between the input port 1 and the output port 2 shown in FIG. 1, as the diode bridge exhibits a very high input impedance during the off condition which would result in a standing wave being produced, as previously described. Additionally, the four diodes have a significant capacitance which enables a high frequency signal to breakthrough from the input terminal to the output terminal.

Figure 2:
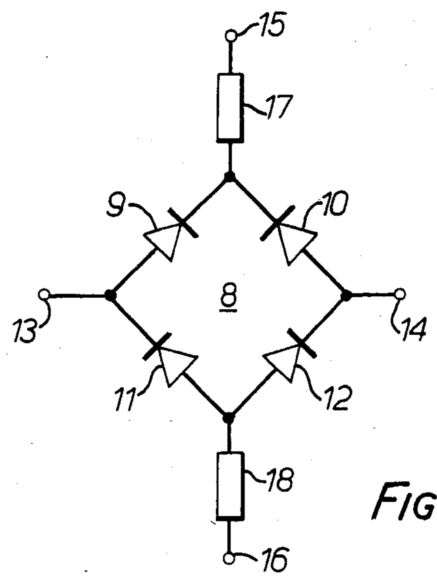

In principle by utilising four of the diode bridges shown in FIG. 2 and connecting them as indicated in FIG. 1, a switching circuit having an extremely good performance can be produced. Where the performance requirements are not particularly stringent, it may be possible to use only switches 3 and 5. When these are implemented as diode bridges, the signal present at the output of switch 3 will be reasonably good. It is likely, however, that some high frequency signal breakthrough will occur, and the performance can be further improved in this respect by providing means for attenuating any signal which does breakthrough switch 3 whilst it is nominally non-conductive. This signal can be removed as previously described by the use of switches 4 and 6, or alternatively, or in addition, it can be attenuated by the provision of additional diodes connected to the bias input points of the four-diode bridge which constitutes switch 3. This modification and the switching circuit as a whole is described in greater detail in FIG. 3.

Figure 3:
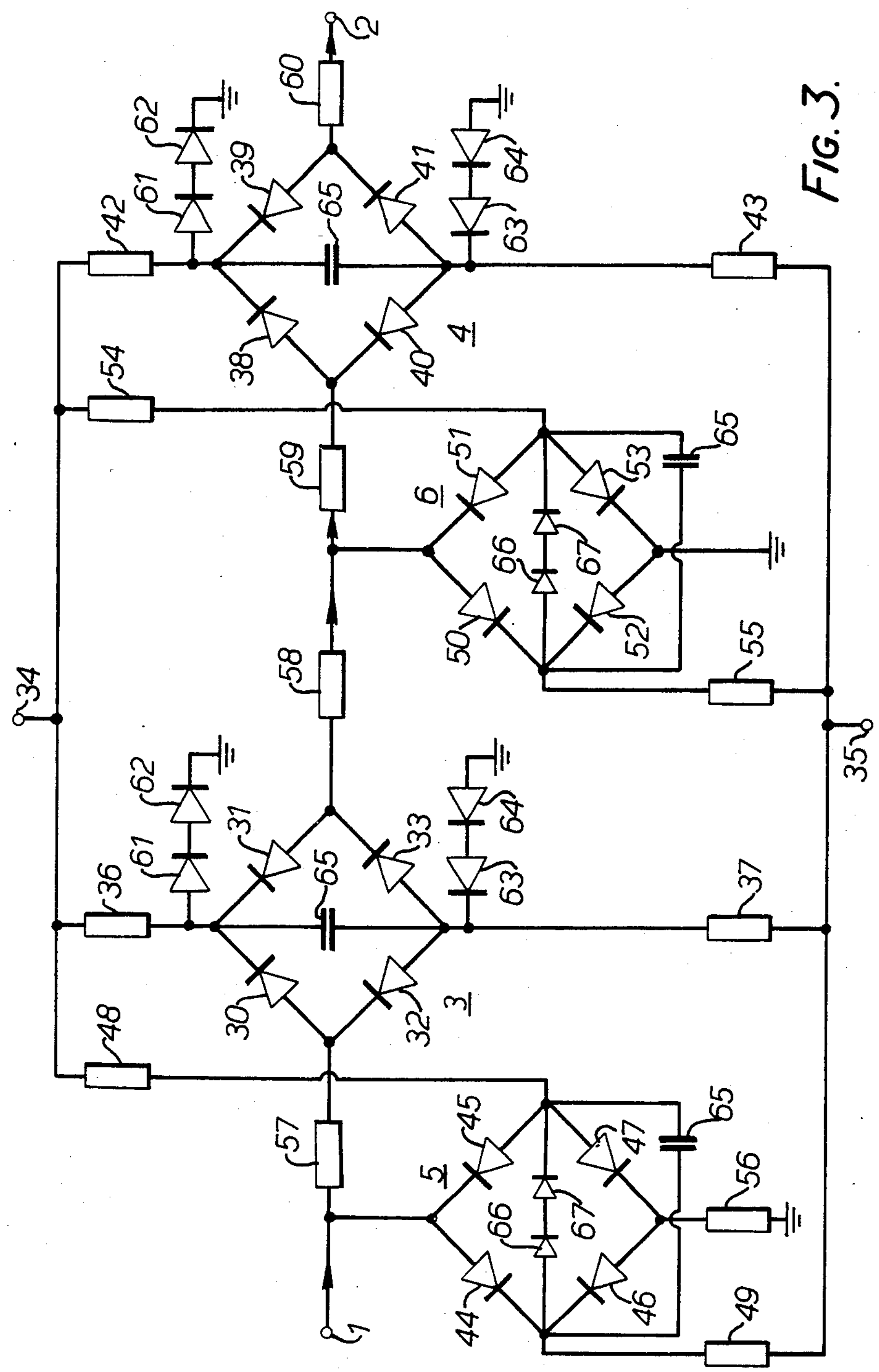

Referring to FIG. 3, reference numerals corresponding to those appearing in FIG. 1 are used to identify similar features. Thus an r.f. carrier signal is applied to input port 1, and is transfered via two serially connected diode bridges 3 and 4 to an output port 2 whilst the two diode bridges are conductive. Two shunt connected diode bridges 5 and 6 are provided to attenuate the r.f. signal, whilst diode bridges 3 and 4 are non-conductive.

Diode bridge 3 consists of four diodes 30, 31, 32 and 33, which are connected between two bias terminals 34 and 35 via current limiting resistors 36 and 37. Similarly, diode bridge 4 consists of four diodes 38, 39, 40 and 41 which are connected to the same two bias terminals 34 and 35 via current limiting resistors 42 and 43. The shunt connected diode bridge 5 consists of four diodes 44, 45 and 46 and 47 which are connected to the two bias terminals 34 and 35 via current limiting resistors 48 and 49. Similarly, diode bridge 6 consists of four diodes 50, 51, 52 and 53 which are connected between the same two bias terminals 34 and 35 via current limiting resistors 54 and 55. An impedance matching resistor 56 is connected between the diode bridge 5 and a reference potential, which in this case is earth.

It will be appreciated that the current limiting resistors 36, 37, 42, 43, 48, 49 and 54, 55 conduct current from the r.f. signal path and so effectively power the input impedance of the switching circuit. To compensate for this, four serial resistors 57, 58, 59 and 60 are provided, so that together with the current limiting resistors they constitute a transmission line having a characteristic impedance equal to the required value for the signal path—the required value will be determined by the characteristic impedance of the preceding and following stages which are connected to the input and output ports respectively of the switching circuit.

The switching circuit, as so far described, operates as follows. Switching potentials are applied to terminals 34 and 35 in anti-phase so as to switch all four diode bridges together. Typically, the potentials will be plus and minus 5 volts with respect to earth, but the potential applied to one of the two terminals 34 or 35 can be adjusted slightly from its nominal value in order to produce a d.c. off-set for the diode bridges which is exactly zero. It will be seen that the two diode bridges 3 and 4 are rendered conductive together, whilst the other two diode bridges 5 and 6 are non-conductive, and vice versa, thereby producing a circuit which is equivalent to that shown diagrammatically in FIG. 1.

In order to provide additional attenuation of any signals which break through diode bridge 3 when it is rendered non-conductive, the additional diodes 61, 62, 63 and 64 are provided.

In each case pairs of serially connected diodes are shown, but in principle only a single diode connected to each bias point of the two bridges 3 and 4 could be used. The use of two diodes, as shown, has the advantage that it takes a higher level of r.f. carrier signal at these bridges to unintentionally turn the diodes on when the carrier is pulsed on. Similarly, when the carrier is pulsed off, it takes a higher level of r.f. signal to turn on diodes, such as diodes 30 and 32, unintentionally. If this aspect is not of significance, only a single diode, e.g. diode 61, instead of a pair of diodes could be used with advantage, as this has the effect of lowering the shunt impedance formed at the bias points, and hence improves signal isolation.

When the carrier signal is pulsed off, by rendering diode bridge 3 non-conductive by the application of a positive potential to terminal 34 and the application of negative potential to terminal 35, this has the effect of

DIODE BRIDGE SWITCHING CIRCUIT WITH HIGH ATTENUATION

This invention relates to switching circuits and to electrical circuits which incorporate them. The switching circuit is particularly suitable for switching a high frequency signal between two different amplitude levels so as to produce a pulse modulated high frequency signal. The need arises to produce such a signal which has a predetermined level for the duration of the pulses, but which has a substantially zero level, or a different predetermined level, between the pulses. In principle, this can be achieved by simply keying the output of a high frequency source on and off in accordance with the required pulse sequence so that the signal is either present or it is not, but in practice this results in poor performance both because of unacceptable breakthrough of the high frequency signal and because fast switching speeds are difficult to achieve.

The present invention seeks to provide an improved switching circuit.

According to this invention, a switching circuit for switching a high frequency signal includes a serially connected first switchable four-arm diode bridge connected between an input port and an output port; a shunt connected second switchable four-arm diode bridge connected between the input side of the first bridge and impedance matching means which is arranged to present a predetermined matched value to the input port whilst the second bridge is conductive; and means for controlling the conductive states of said first and second bridges so that one is conductive whilst the other is non-conductive and vice versa.

By the term four-arm diode bridge is meant four diodes serially connected to form a closed ring, in which one pair of diodes is poled in one sense in the ring and the other pair is poled in the opposite sense, and in which the mid-point between the two diodes of one pair is an input point, the mid-point of the other pair is an output point and the two junction points between the two pairs being bias points. When a bias potential of one polarity is applied between the two bias points the four diodes are biassed into their fully conductive states, whereas a bias potential of the opposite polarity reverse biasses the four diodes so that they are fully non-conductive.

When the serially connected first diode bridge is conductive and the shunt connected diode bridge is not conductive, a high frequency signal which is present at the input port is transferred to the output port for utilisation as required. Conversely, when the serially connected diode bridge is not conductive, but the shunt connected diode bridge is conductive, the high frequency signal is not presented to the output port, but instead is shunted to ground or some other reference potential. The impedance matching prevents the generation of reflected or standing wave signals which would adversely affect the level of the signal present at the input port. This is an important consideration since the level of the input signal will generally be precisely controlled by means of a preceding level control circuit, and any reflected or standing waves would appear as an error in the signal level which the level control circuit would seek to correct.

Figure 4:
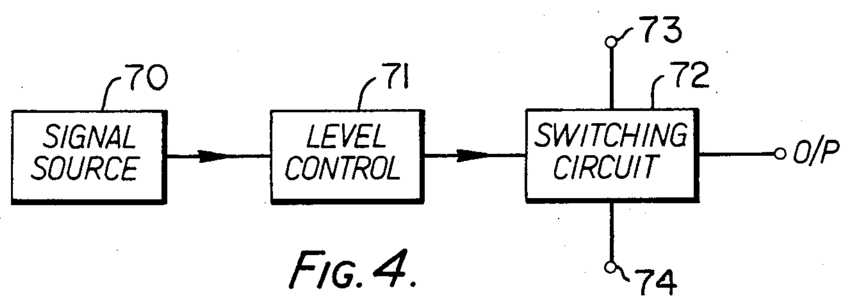

The invention is further described by way of example with reference to the accompanying drawings, in which FIG. 1 shows a switching circuit in accordance with the invention in a simple diagrammatic form, FIG. 2 shows a four-arm diode bridge which is incorporated in the switching circuit, FIG. 3 shows the switching circuit in greater detail, and FIG. 4 shows a signal generator incorporating the switching circuit.

Referring to FIG. 1, a switching circuit receives a high frequency carrier signal at an input terminal 1 and makes it available at an output terminal 2 when required. In practice, the high frequency signal at terminal 1 will be provided by a preceding level control circuit (not shown) which generates a signal having a precisely controlled amplitude level relative to some reference potential, usually earth. By rapidly chopping the input signal, a pulse modulated output signal is produced. The pulse modulated signal consists merely of a sequence of pulses separated by intervals at which the signal is held at the reference potential, usually earth. A requirement for this kind of pulse modulation often arises in connection with the testing of electrical equipment, and in particular a signal of this kind facilitates the testing of radar systems. In this case, the on to off signal level ratio is required to be as great as possible, and the rise and fall times of the leading and trailing edges of the pulses are required to be as short as possible. The performance specification may be quite stringent so that irregularities in the pulses and carrier overshoot at the beginning and end of each pulse must be carefully controlled to acceptable levels.

In FIG. 1, two serially connected switches 3 and 4 are connected between the input terminal 1 and the output terminal 2, and in addition two shunt connected switches 5 and 6 are provided. Switch 5 is connected via a matching impedance 7 to earth whereas switch 6 is connected directly to earth. By rendering switches 3 and 4 conductive, the input signal is transferred directly to the output terminal, and at this time, switches 5 and 6 are held non-conductive. Conversely, the intervals between pulses are produced by rendering switches 3 and 4 non-conductive whilst switches 5 and 6 are rendered conductive. The provision of the matching impedance 7 prevents the generation of a reflected or standing wave at the terminal 1 which would adversely affect the level of the signal applied to the switching circuit. Often a switching circuit is preceded by a level control circuit which generates the precisely required amplitude level. Any reflected or standing wave produced at terminal 1 by the switching circuit would appear as a level error which the level control circuit would attempt to correct. Typically, the switching circuit operates at a carrier frequency of 70 MHz, although this figure is given by way of example and in practice the carrier frequency may be significantly greater of significantly less. At these frequencies signal breakthrough across switch 3 can occur even through it is nominally non-conductive. Any signal which does breakthrough is shorted to earth by the conductive switch 6, whilst the switch 4, which is non-conductive, prevents any of the breakthrough signal from reaching terminal 2. This configuration of switches therefore provides extremely good isolation between terminals 1 and 2 for those intervals between output pulses, but enables the attenuation of pulses themselves to be minimised and held to a controlled level.

The nature of the switches 3, 4, 5 and 6 is shown in FIG. 2. Each switch comprises a four-arm diode bridge rendering the additional diodes 61 to 64 conductive. Thus these diodes form a short circuit to earth and hence attenuate any unwanted signal breakthrough. This results in a significantly improved carrier isolation of output port 2 relative to input port 1.

In practice, it is likely that the turn on and turn off times of the four diodes in a particular bridge will not be exactly the same as each other. If one diode turns on or off slightly ahead of the others, a discontinuity may be introduced into the output signal. This discontinuity will be manifest as signal transients which are most undesirable. To reduce this effect capacitors 65 are diagonally connected across each diode bridge between the bias points. These capacitors 65 cause uniform turn on and turn off rates which would otherwise stem from differential charge storage effects for the different diodes.

It will be appreciated that the additional diodes 61 to 64 connected to diode bridges 3 and 4 slow the switching speeds of these two bridges, but it is desirable that all four diode bridges have identical switching characteristics to avoid the generation of unacceptable signal transients. Accordingly, additional diodes 66 and 67 are provided in diode bridges 5 and 6 in shunt with the capacitor 65, so that in effect all four diode bridges 3, 4, 5 and 6 exhibit the same type of charge storage effects. These diodes 66 and 67 do not affect the signal path for the r.f. signal applied to the input port, but simply tailor the switching speeds of the diode bridges.

The very high degree of signal isolation which the circuit shown in FIG. 3 is capable of providing could be degraded by r.f. signal breakthrough occurring via the bias circuits which turn the diodes on and off. To avoid this problem arising, each of the four diode bridges 3, 4, 5 and 6 are preferably provided with independent bias voltage supplies, even though for the sake of convenience and clarity only a single pair of common terminals 34 and 35 are illustrated.

The switching circuit is particularly suitable for generating a pulse modulated output signal by switching a high frequency carrier signal which is applied to it. A continuous carrier signal is fed from a signal source via a level control circuit, which produces a constant amplitude level, to the switching circuit. The switching circuit chops the carrier signal to produce a sequence of pulses, i.e. bursts of the carrier signal which are separated by intervals during which the signal is held at a reference, usually earth, level. Such a sequence is termed a pulse modulated signal.

A signal generator of this kind is shown in FIG. 4. A high frequency signal source 70 generates a high frequency signal, which may be of fixed or variable frequency, and which is fed to a level control circuit 71 which ensures that the signal has a constant and predetermined amplitude level. The levelled carrier signal is converted into a pulse modulated signal by a switching circuit 72, which takes the form of that shown in FIG. 3. Bias signals are applied to modulation terminals 73 and 74 in anti-phase to produce the switching action previously described.

I claim:

1. A switching circuit including a first switchable four-arm diode bridge connected between an input port and an output port and connected between a pair of bias terminals;

a second switchable four-arm diode bridge connected to said input port in shunt with said first bridge;

impedance matching means connected to said second bridge for presenting a predetermined matched value to said input port whilst said second bridge is conductive;

attenuation means for attenuating any high frequency signal breaking through said first diode bridge whilst in a non-conductive state, said means including a third switchable four-arm diode bridge connected in shunt with said first bridge between said output port and a reference potential level, said third bridge having a conductive state controlled in step with said second bridge to correspond therewith; and means connected to said bridges for controlling the conductive states of said first and second bridges so that said first bridge is conductive whilst said second bridge is non-conductive and vice versa.

2. A switching circuit as claimed in claim 1 wherein a fourth four-arm diode bridge is connected in series between an output point of said first diode bridge and said output port, said fourth bridge having a pair of bias terminals, the conductive state of said fourth bridge being controlled in step with said first bridge so as to correspond therewith.

3. A switching circuit as claimed in claim 2 and wherein a respective diode is provided between each bias terminal of said fourth diode bridge and a reference potential level, the conductive states of said diodes being controlled in step with said second diode bridge to correspond therewith for attenuating a signal breaking through said fourth bridge.

4. A switching circuit as claimed in claim 8 and wherein a respective pair of diodes are provided between each bias terminal of said fourth diode bridge and a reference potential level, each diode of a pair being connected in series with the other diode, and the conductive states of said two pairs of diodes being controlled in step with said second diode bridge to correspond therewith for attenuating a signal breaking through said fourth bridge.

5. A switching circuit as claimed as in any of claims 2 to 4 and 1 wherein each diode bridge includes a capacitor connected between said two bias terminals thereof.

6. A switching circuit as claimed in any of claims 2 to 4 and 1 wherein each diode bridge is provided with separate means for applying bias potentials to said bias terminals thereof.

7. A switching circuit as claimed in claim 1 wherein said attenuation means includes two diodes, each of which is connected between a respective bias point of the first diode bridge and a reference potential level, the conductive states of said two diodes being controlled in step with said second diode bridge so as to correspond therewith.

8. A switching circuit as claimed in claim 1 wherein said attenuation means includes two pairs of diodes, each diode of a pair being connected in series with the other diode, and each pair being connected between a respective bias point of the first diode bridge and a reference potential level, the conductive states of said two pairs of diodes being controlled in step with said second diode bridge so as to correspond therewith.

9. A signal generator including a source of high frequency signals having a regulated amplitude level; and a switching circuit arranged to receive and derive from said high frequency signals a pulse modulated signal, said switching circuit including a first switchable four-arm diode bridge connected between an input port for receiving said signals and an output port for delivering a pulse modulated signal, a second switchable four-arm diode bridge conntected to said input port in shunt with said first bridge; impedance matching means for presenting a predetermined matched value to said input port whilst said second bridge is conductive; attenuation means for attenuating any high frequency signal breaking through said first diode bridge whilst in a non-conductive state, said means including a third switchable four-arm diode bridge connected in shunt with said first between said output port and a reference potential level, said third bridge having a conductive state controlled in step with said second bridge to correspond therewith; and means connected to said bridges for controlling the conductive states of said first and second bridges os that said first bridge is conductive whilst said second bridge is non-conductive and vice versa.

* * * * *

UNITED STATES PATENT AND TRADEMARK OFFICE
CERTIFICATE OF CORRECTION

PATENT NO. : 4,543,495

DATED : September 24, 1985

INVENTOR(S) : David P. Owen

It is certified that error appears in the above-identified patent and that said Letters Patent is hereby corrected as shown below:

Column 2, line 55 change "of" to -or-

Column 4, line 24 change "power" to -lower-

Column 8, line 1 change "first" to -first bridge-

Signed and Sealed this

*Twenty-fourth* Day of *December 1985*

[SEAL]

*Attest:*

DONALD J. QUIGG

*Attesting Officer* *Commissioner of Patents and Trademarks*